United States Patent [19]
Williamson et al.

[11] Patent Number: 6,015,732
[45] Date of Patent: Jan. 18, 2000

[54] DUAL GATE OXIDE PROCESS WITH INCREASED RELIABILITY

[75] Inventors: Jon Roderick Williamson; Subhash R. Nariani, both of San Jose, Calif.

[73] Assignee: VLSI Technology, Inc., San Jose, Calif.

[21] Appl. No.: 08/709,479

[22] Filed: Sep. 6, 1996

[51] Int. Cl.$^7$ .................................................. H01L 21/8242
[52] U.S. Cl. ............................................. 438/253; 438/396
[58] Field of Search ..................................... 438/238, 239, 438/253–256, 381, 391–399, 263, 264, 287, 981

[56] References Cited

U.S. PATENT DOCUMENTS 5,218,511  6/1993  Nariani .
5,633,181  5/1997  Hayashi ................................... 438/234
5,656,533  8/1997  Kim ......................................... 438/396
5,668,035  9/1997  Fang et al. .............................. 438/239

*Primary Examiner*—Joni Chang
*Attorney, Agent, or Firm*—Douglas L. Weller

[57] ABSTRACT

Within a dual gate oxide process, gate oxide is formed within regions on a substrate. Gate material, such as polysilicon, is placed over a first region. The gate material extends over field oxide surrounding the first region. Gate oxide within a second region is stripped. The gate material over the first region prevents gate oxide within the first region from being stripped. A new layer of gate oxide is formed within the second region. A first transistor gate is formed within the second region. The gate material which is over the first region is etched to form a second transistor gate.

14 Claims, 5 Drawing Sheets

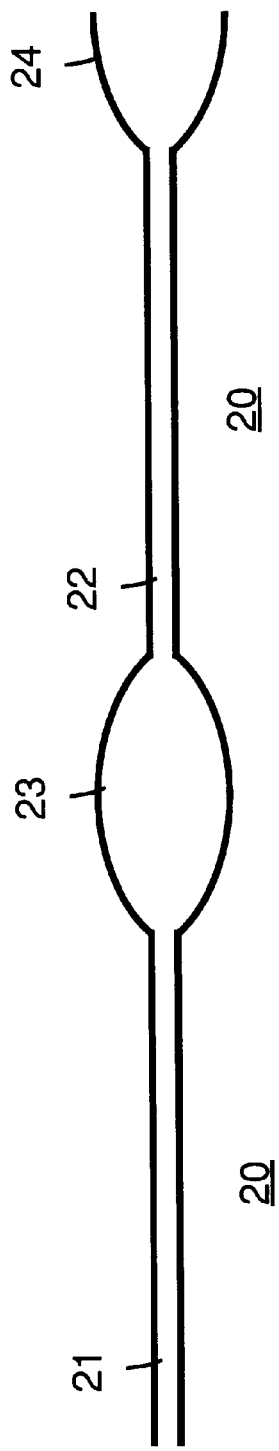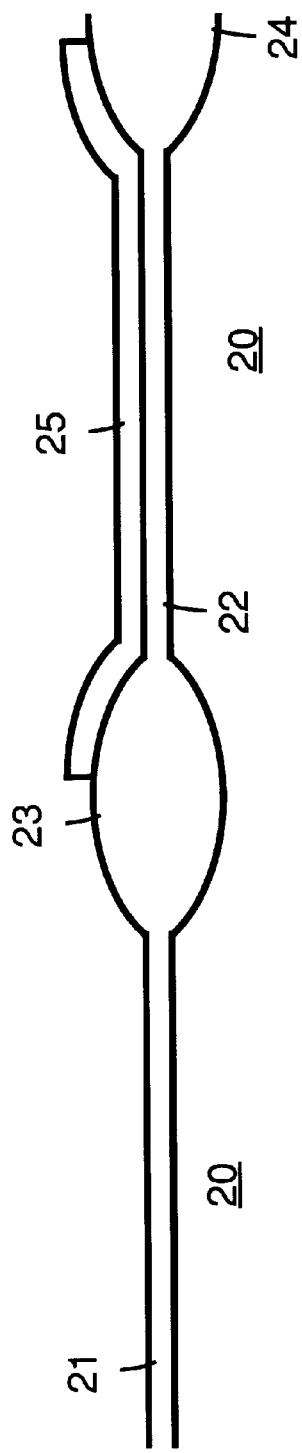

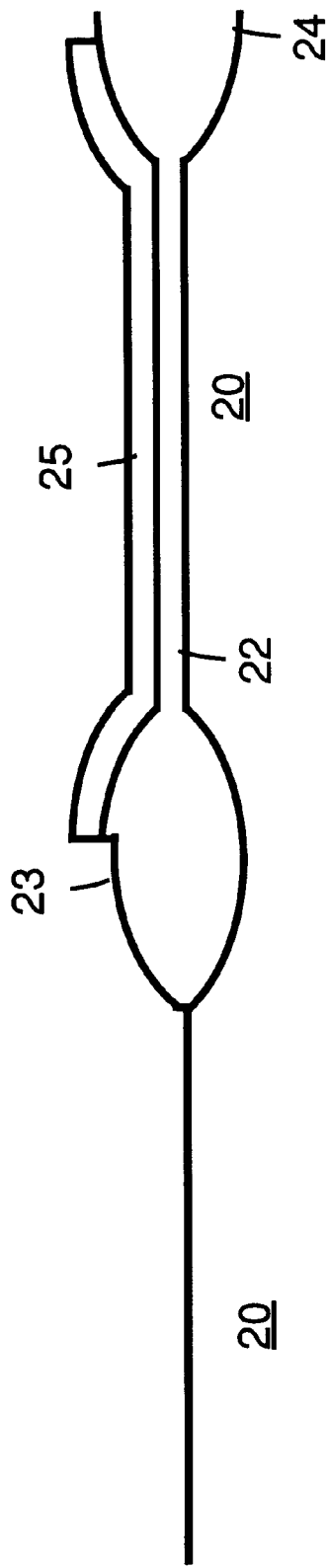
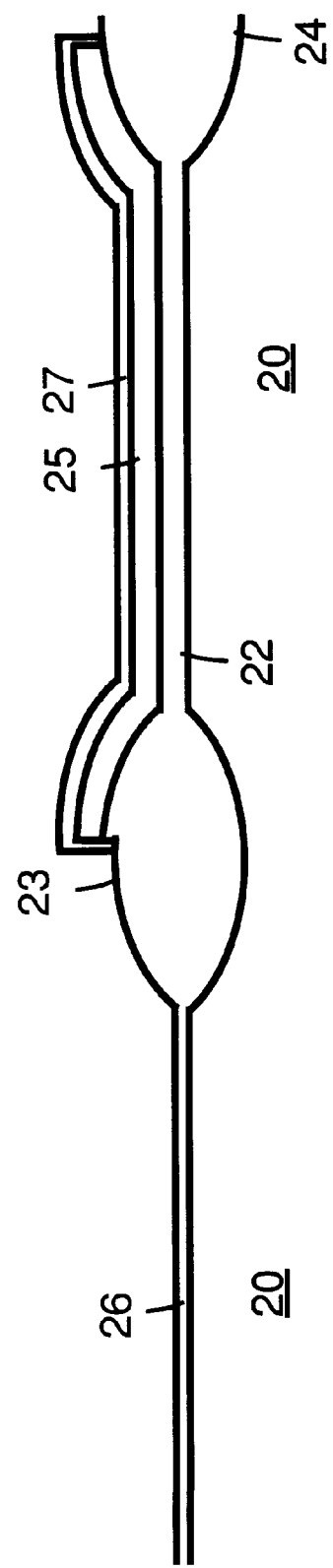
FIGURE 3
FIGURE 4

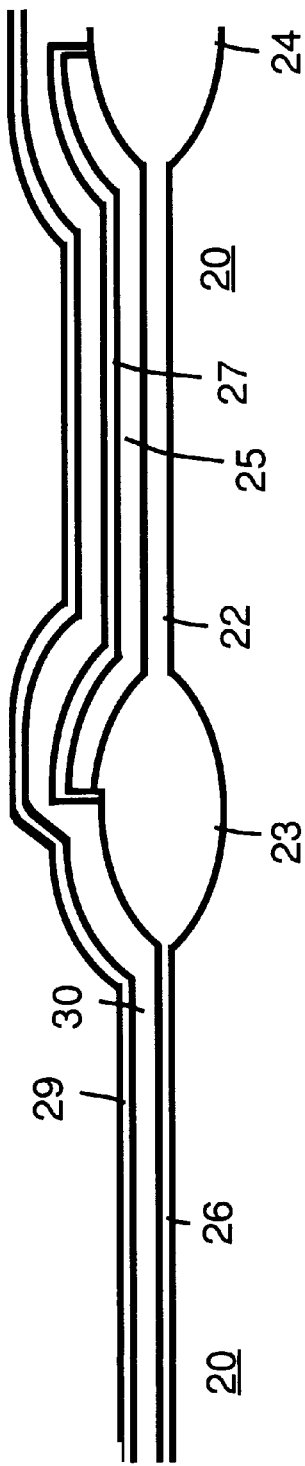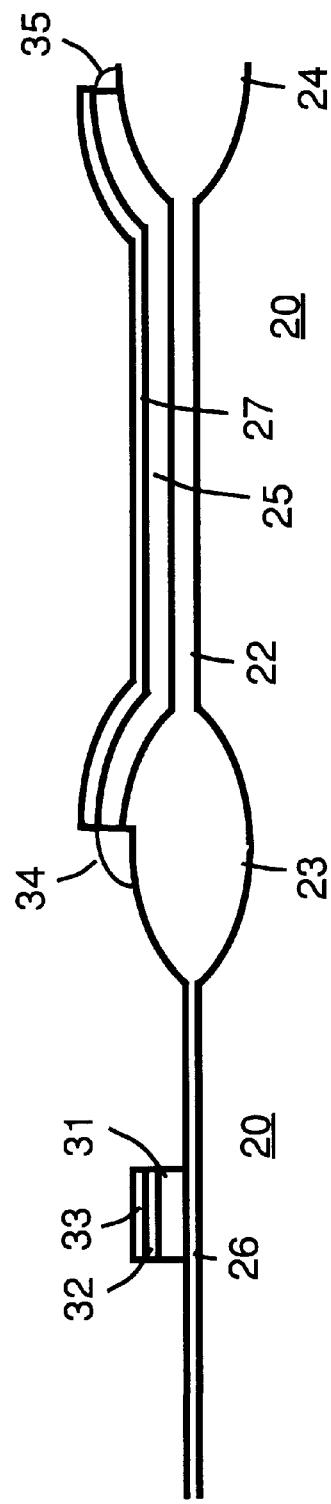

DUAL GATE OXIDE PROCESS WITH INCREASED RELIABILITY

BACKGROUND

The present invention concerns the fabrication of integrated circuits and pertains particularly to a reliable process for forming gates with different gate oxide thicknesses while avoiding polysilicon stringers.

For integrated circuits which utilize 3.3 volt technology, the nominal power supply is at 3.3 volts while the signals may switch between 3.3 volts and 0 volts. When constructing an integrated circuit which uses 3.3 volt technology, it is often desirable that some of the transistors on the integrated circuit be able to tolerate placement of 5 volt signals on the gate of the transistors used for input/output (I/O) cells of the integrated circuit. When the gate oxide thickness for the 3.3 volt technology cannot support 5 volt operation, a dual gate oxide process is used. That is, the thickness of the gate oxide for transistors in the core of the integrated circuit is thinner than the gate oxide for transistors in the I/O cells of the integrated circuit where the transistors are 5 volt tolerant.

Current dual gate oxide processes generally begin by growing a thick gate oxide which is optimized for transistors which are able to tolerate 5 volt signals. Within the I/O cells, gates for 5 volt tolerant transistors are defined. Polysilicon is deposited and then etched to form the gates for 5 volt tolerant transistors. In the core of the integrated circuit, the thick gate oxide which is suitable for transistors which are able to tolerate 5 volt signals is too thick for transistors which are controlled by 3.3 volt signals. Therefore, for transistor cells in the core of the integrated circuits, the thick gate oxide is stripped and a thinner gate oxide is grown which is suitable for transistors which are controlled by 3.3 volt signals.

When stripping the thick gate oxide for transistor cells in the core of the integrated circuit, the thick gate oxide within the I/O cells which is exposed will also be stripped, possibly resulting in undercutting the gate oxide under the polysilicon gates which have been formed for 5 volt tolerant transistors. This can be avoided by masking I/O cells with photo resist. However, when the photo resist is removed from the I/O cells, this can result in damage or contamination of the oxides, which can result in reduced product yield or reliability.

Once the thinner gate oxide which is suitable for transistors which are controlled by 3.3 volt signals is grown, gates are formed for transistors within the core of the integrated circuit. For example, for polycide gates, a polysilicon (poly2) layer, a metal layer (such as titanium-tungsten (TiW)) and a dielectric layer (such as TEOS oxide) are deposited and patterned (using an anisotropic etch) to define the gate regions. The process of forming the polycide gates in the core region of the integrated circuits often results in the formation of polysilicon (poly2) strings on the sidewalls of the gates for transistors within the I/O cells. The poly2 stringers can cause shorting between transistors within the I/O cells. In addition, the poly2 stringers can also prevent proper alignment of subsequent lightly doped drain (Ldd) implants.

Because of the drawbacks of present processes, it is desirable to come up with a dual gate oxide process which will strengthen electrostatic discharge (ESD) tolerance, integrity of the gate oxide and increase hot carrier reliability in 5 volt tolerant I/O cells developed for a 3.3 volt technology. In doing this, it is also desirable to eliminate the flaws inherent in current processes, such as gate oxide damage or contamination, Ldd implant misplacement, sidewall string susceptibility, and poor critical dimension (CD) control.

SUMMARY OF THE INVENTION

In accordance with the preferred embodiment of the present invention, a dual gate oxide process is presented. Gate oxide is formed within regions on a substrate. Gate material, such as polysilicon, is placed over a first region. The gate material extends over field oxide surrounding the first region. The first region is, for example, used as a 5 volt tolerant I/O cell. Gate oxide within a second region is stripped. The second region is, for example, used as an 3.3 volt core cell. The gate material over the first region prevents gate oxide within the first region from being stripped. A new layer of gate oxide is formed within the second region. A first transistor gate is formed within the second region. The gate material which is over the first region is etched to form a second transistor gate.

For example, in one embodiment of the present invention, the transistor gate formed within the first region is formed of polysilicon. In alternate embodiments the transistor gate may be a polycide gate, formed for example, of polysilicon and metal-silicide.

Also, in the preferred embodiment, the transistor gate of the second region is a polycide gate, formed for example, of polysilicon, metal-silicide and a dielectric. In alternate embodiments the transistor gate may be formed of polysilicon.

Also, within the preferred embodiment, when forming the second transistor gate, a first photo mask section is formed over a portion of the gate material over the first region, while a second photo mask section is formed over the second region. An unmasked portion of the gate material over the first region is etched in order to form the second transistor gate.

In various embodiments of the present invention, using the same method steps, a capacitor can be formed along with, or instead of the transistor gate formed in the first region. For example, when placing gate material over a first region, the gate material may also (or instead) be placed over a third region. The gate material over the third region prevents gate oxide within the third region from being thinned. A capacitor top electrode is formed within the third region concurrent with the formation of the first transistor gate in the second region. The gate material which is over the third region is etched to form a capacitor bottom electrode at the same time as (or instead of) the gate material over the first region being etched to form the second transistor gate.

The present invention sets out a dual gate oxide process which will strengthen electrostatic discharge (ESD) tolerance, integrity of the gate oxide and increase hot carrier reliability in 5 volt tolerant I/O cells developed for a 3.3 volt technology. The present invention also provides for the elimination of the flaws inherent in current processes, such as gate oxide damage, Ldd implant misplacement, sidewall string susceptibility, and critical dimension (CD) control. The present invention can be used for any dual gate oxide process required for dual voltage applications (e.g., 3.3 volts and 2.5 volts).

BRIEF DESCRIPTION OF THE DRAWINGS

FIGS. 1, 2, 3, 4, 5, 6, 7 and 8 illustrate a method for forming gates with different gate oxide thicknesses in accordance with a preferred embodiment of the present invention.

DESCRIPTION OF THE PREFERRED EMBODIMENT

Figure 7:
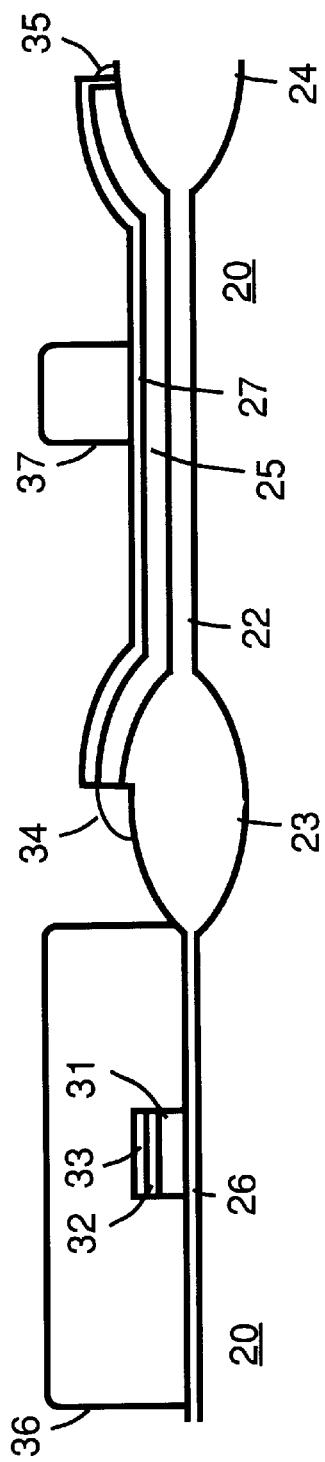

The present invention provides a method for forming gates with different gate oxide thicknesses.

FIG. 1 shows the result of conventional semiconductor processing used to place field oxide. On a substrate 20, a local oxidation of silicon (LOCOS) process or other process is used to form field oxide regions 23 and 24. For example, in a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed.

After field oxide regions 23 and 24 are formed, a layer of gate oxide is placed (i.e. grown or deposited) on exposed portions of the substrate. The layer of gate oxide is represented in FIG. 1 by a gate oxide region 21 and a gate oxide region 22. For the purposes of explaining the present invention, gate oxide region 21 is assumed to be within the core of an integrated circuit where it is desired to build a transistor for control by a 3.3 volt signal. Gate oxide region 22 is assumed to be within an I/O cell of the integrated circuit where it is desired to build a transistor for control by a 5 volt signal. Gate oxide region 21 and gate oxide region 22 are, for example, 120 angstroms (Å) thick, which is generally suitable for transistors which are able to tolerate 5 volt signals, but is often too thick for transistors which are controlled by 3.3 volt signals.

A first layer of polysilicon (poly1) is deposited over the wafer. For example, the deposition may be a chemical vapor deposition (CVD). The polysilicon is doped, for example, with n-type atoms at approximately $10^{20}$ atoms per cubic centimeter. The doping may be performed using $POCl_3$. Alternately, an implant of Phosphorus or Arsenic atoms may be used. Alternately, an in situ doped polysilicon may be deposited. When formed, the polysilicon layer is, for example, 0.20 microns thick.

In the embodiment illustrated by FIGS. 1 through 7, a polysilicon gate is used for the transistors within the I/O cells. In alternate embodiments of the invention, polycide gates may be used instead of polysilicon gates. In such embodiments, at this point, additional layers would be deposited. For example, in one alternate embodiment, a metal-silicide layer is formed on top of the poly1 layer, for example by chemical vapor deposition at approximately 400 degrees Centigrade or by sputtering at approximately 200 degrees Centigrade. For example, the metal-silicide may be Tungsten-silicide. The metal used for the metal-silicide layer may alternately consist of, for example, Titanium (Ti) Molybdenum (Mo), Chromium (Cr), Nickel (Ni), Cobalt (Co), or Tantalum (Ta). A dielectric layer may then be formed on top of metal-silicide layer region. The dielectric layer may be, for example, a deposited silicon oxide using TEOS as the source of the silicon (also referred to as TEOS oxide). When deposited, the TEOS oxide is approximately 0.1 microns thick. Alternate sources of silicon for the deposited oxide are silane, dichlorosilane or other organic silicon sources. Alternative to the use of deposited oxide, thermally grown oxide may be used. Also, as an alternative to using an oxide dielectric, a sandwich of oxide, nitride and oxide sub-layers may be used for the dielectric layer. As is understood in the art, the formation of the oxide, nitride and oxide sublayers may be achieved using processing operating at temperatures below 850 degrees Centigrade.

Once the poly1 layer is deposited (and any additional layers if a polycide gate is used), a photo mask and anisotropic etch process is used to remove the poly1 layer from the core region of the integrated circuit. The remaining polysilicon, represented in FIG. 2 by a polysilicon region 25, is used to protect the gate oxide regions within the I/O cells, represented by gate oxide region 22, from subsequent processing. The edge of the polysilicon regions are defined over field oxide regions in order to prevent any adverse effects which could result from polysilicon stringers. The definition of the edge of the polysilicon regions over field oxide regions is represented in FIG. 2 by the edges of polysilicon region 25 being defined over field oxide region 23 and field oxide region 24.

The gate oxide within the core region of the integrated circuit, represented in FIG. 2 by gate oxide region 21, is too thick for transistors which are controlled by 3.3 volt signals. Therefore, gate oxide region 21 is stripped away. The polysilicon over the I/O cells protects the gate oxide for the transistors in the I/O cell regions. This prevents the potential undercutting of gates in the I/O cell regions which can occur when the gates within the I/O cell regions are formed before stripping the gate oxide within the core regions. The result after stripping the gate oxide within the core regions is illustrated by FIG. 3 which shows that gate oxide region 21 has been stripped away while gate oxide region 22 remains intact under polysilicon region 25.

A second layer of gate oxide is placed (i.e. grown or deposited) on exposed portions of the substrate. The layer of gate oxide is represented in FIG. 4 by a gate oxide region 26 and additional oxide region 27. Gate oxide region 26 is, for example, 80 Å thick, which is generally suitable for transistors which are controlled by 3.3 volt signals.

A second polysilicon (poly2) layer 30 is deposited over the wafer, as illustrated by FIG. 5. For example, the deposition may be a chemical vapor deposition (CVD). The polysilicon is doped, for example, with n-type atoms at approximately $10^{20}$ atoms per cubic centimeter. The doping may be performed using $POCl_3$. Alternately, an implant of Phosphorus or Arsenic atoms may be used. Alternately, an in situ doped polysilicon may be deposited. When formed, polysilicon layer 30 is, for example, 0.20 microns thick.

In the embodiment illustrated by FIGS. 1 through 7, a polycide gate is used for the transistors within the core cells. Thus in this case, a metal-silicide layer 29 is formed on top of poly2 layer 30, for example by chemical vapor deposition at approximately 400 degrees Centigrade or by sputtering at approximately 200 degrees Centigrade. For example, the metal-silicide is Tungsten-silicide. The metal used for the metal-silicide layer may alternately consist of, for example, Titanium (Ti) Molybdenum (Mo), Chromium (Cr), Nickel (Ni), Cobalt (Co), or Tantalum (Ta). A dielectric layer is then formed on top of metal-silicide layer 29. The dielectric layer may be, for example, a deposited silicon oxide using TEOS as the source of the silicon (also referred to as TEOS oxide). When deposited, the TEOS oxide is approximately 0.1 microns thick. Alternate sources of silicon for the deposited oxide are silane, dichlorosilane or other organic silicon sources. Alternative to the use of deposited oxide, thermally grown oxide may be used. Also, as an alternative to using an oxide dielectric, a sandwich of oxide, nitride and oxide sub-layers may be used for the dielectric layer. As is understood in the art, the formation of the oxide, nitride and oxide sublayers may be achieved using processing operating at temperatures below 850 degrees Centigrade.

In the embodiment illustrated by FIGS. 1 through 7, a polycide gate is used for the transistors within the core cells. In alternate embodiments of the invention, polysilicon gates may be used instead of polycide gates. In such embodiments, the additional metal-silicide and dielectric layer, described above, would not be deposited.

A photo mask and anisotropic etch process is used to form gate regions within the core of the integrated circuit. This is illustrated in FIG. 6 by the gate consisting of a poly2 region 31, a metal-silicide region 32 and a dielectric region 33. Polysilicon stringers of polysilicon from the poly2 layer may form at the edges of the poly1 regions, however since these edges are over the field oxide, this will not cause shorting between the finished gates of transistors within the I/O cells, nor will the polysilicon stringers prevent proper alignment of subsequent lightly doped drain (Ldd) implants. In FIG. 6, a polysilicon stringer 34 is shown over field oxide region 23 and a polysilicon stringer 35 is shown over field oxide region 24.

A third photo mask and anisotropic etch process is then used to form gate regions within the 1,0 cells of the integrated circuit. The photo resist layer masks the core area of the integrated circuit and masks the gate regions within the I/O cells. This is illustrated in FIG. 7 by a photo resist layer section 36 masking the core region over gate oxide region 26 and a photo resist layer section 37 masking a gate region of poly1 region 25.

Figure 8:
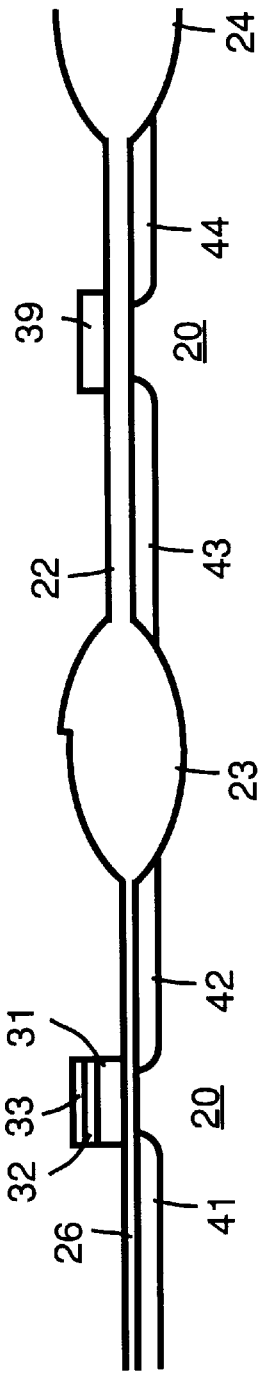

During anisotropic etching, the portion of poly1 region 25 over field oxide regions 23 and 24 are removed along with the adjoining sidewalls formed by the polysilicon stringers. This results in a clearly defined gate structure of poly1, illustrated in FIG. 8 by gate region 39 formed of poly1. At this point conventional processing continues, for example, with the implant of lightly doped drain (Ldd) regions 41, 42, 43 and 44. Since the methodology of the present invention results in there being no sidewalls formed by polysilicon stringers, the Ldd implants can be accurately positioned.

The above-described method can used to produce polysilicon to polysilicon capacitors. These capacitors can be used, for example, as stand-alone capacitors. Additionally, the capacitors can be used, for example, for control of a transistor gate. Transistors with gates controlled through capacitors can be used, for example, in the construction of electrical erasable programmable read-only memories (EEPROM).

For example, after second polysilicon (poly2) layer 30 is deposited over the wafer and metal-silicide layer 29 is formed, as illustrated by FIG. 5, the selected area for etch is varied to allow for a polysilicon capacitor to be formed.

Figure 9:
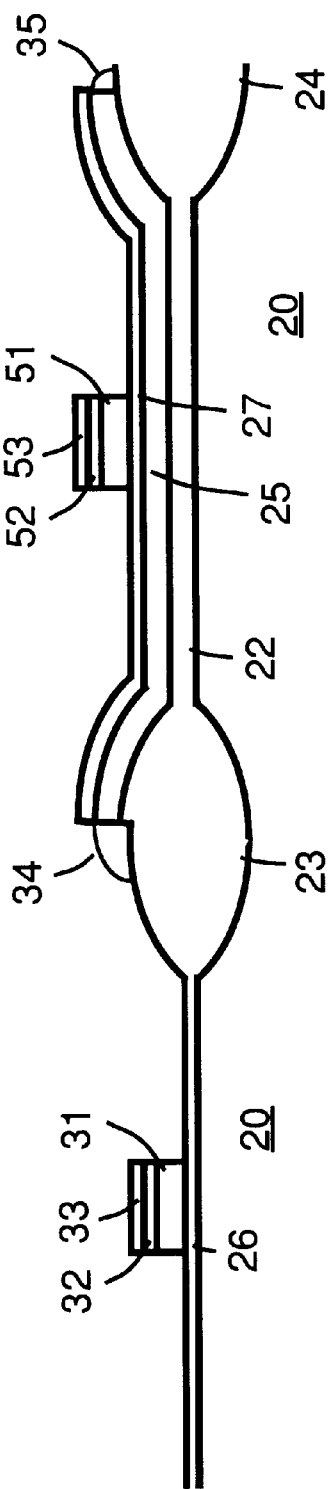
FIGS. 9 and 10 illustrate how the method for forming gates with different gate oxide thicknesses illustrated by FIGS. 1 through 8, can also be used to form capacitors with polysilicon electrodes in accordance with a preferred embodiment of the present invention.

A photo mask and anisotropic etch process is used to form gate regions within the core of the integrated circuit. This is illustrated in FIG. 9 by the gate consisting of a poly2 region 31, a metal-silicide region 32 and a dielectric region 33. In addition, the anisotropic etch process is used to form a capacitor top electrodes where desired. This is illustrated in FIG. 9 by the capacitor top electrode consisting of a poly2 region 51, a metal-silicide region 52 and a dielectric region 53. Polysilicon stringers of polysilicon from the poly2 layer may form at the edges of the poly1 regions, however since these edges are over the field oxide, this will not cause shorting between the finished gates of transistors within the I/O cells, nor will the polysilicon stringers prevent proper alignment of subsequent lightly doped drain (Ldd) implants.

In FIG. 9, a polysilicon stringer 34 is shown over field oxide region 23 and a polysilicon stringer 35 is shown over field oxide region 24.

A third photo mask and anisotropic etch process is then used to form capacitor bottom electrodes. This is the same third photo mask and anisotropic etch process which is used to form gate regions within the I/O cells of the integrated circuit as described above and shown in FIG. 7.

Figure 10:
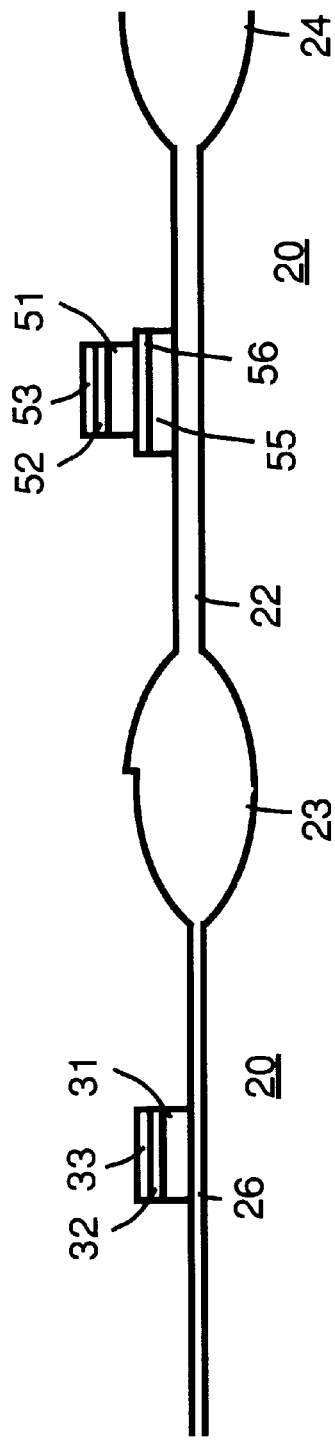

As discussed above, a photo resist layer masks the core area of the integrated circuit and masks the capacitors regions. During anisotropic etching, the portion of poly1 region 25 over field oxide regions 23 and 24 are removed along with the adjoining sidewalls formed by the polysilicon stringers. This results in a clearly defined capacitor bottom electrode structure of poly1, illustrated in FIG. 10 by bottom electrode 55 formed of poly1.

Capacitor dielectric region 56 is formed between bottom electrode 55 and top electrode. In one embodiment of the present invention, the dielectric layer 27 is etched with polysilicon layer 25 to form dielectric region 56. In alternate embodiments of the present invention, dielectric layer 27 may be etched alone to form dielectric region 56 or may be etched with metal-silicide layer 29 and poly2 layer 30. When dielectric layer 27 is etched with metal silicide layer 29 and poly2 layer 30, the dimensions of dielectric region 56 will match the top electrode rather than the bottom electrode.

At this point conventional processing continues, for example, with the implant of lightly doped drain (Ldd) regions. Since the methodology of the present invention results in there being no sidewalls formed by polysilicon stringers, the Ldd implants can be accurately positioned. If Ldd regions are formed on either side of bottom electrode 56 this results in a transistor with capacitor bottom electrode 56 as the gate. The gate is controlled by the capacitor top electrode consisting of poly2 region 51 and metal-silicide region 52. This allows the transistor gate to be controlled through capacitive coupling, such as is useful for applications such as construction of EEPROMs. Alternatively, the capacitor may be used as stand-alone capacitor. In this case, drain implants would not be made on either side of the bottom electrode.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method comprising the following steps:
   (a) forming gate oxide within regions on a substrate;
   (b) forming polysilicon over a first region, the polysilicon extending over field oxide surrounding the first region;
   (c) thinning gate oxide within a second region, the polysilicon over the first region preventing gate oxide within the first region from being thinned;
   (d) forming a first transistor gate within the second region, including the following substeps:
   (d.1) depositing a layer of polysilicon,
   (d.2) depositing a layer of metal-silicide,
   (d.3) depositing a dielectric layer, and
   (d.4) etching the dielectric layer, the layer of metal-silicide and the layer of polysilicon to form the first transistor gate; and,
   (e) after forming the first transistor gate within the second region, etching the polysilicon which is over the first region to form a second transistor gate.

2. A method as in claim 1 wherein step (c) includes the following substeps:
   (c.1) stripping gate oxide within the second region; and,
   (c.2) forming a new layer of gate oxide within the second region, the new layer of gate oxide being thinner than the gate oxide stripped in substep (c.1).

3. A method as in claim 1 wherein step (e) includes the following substeps:
   (e.1) forming a first photo mask over a portion of the polysilicon over the first region, and forming a second photo mask over the second region; and,
   (e.2) etching an unmasked portion of the polysilicon over the first region in order to form the second transistor gate.

4. A method as in claim 1 wherein:
   step (b) includes forming polysilicon over a third region, the polysilicon extending over field oxide surrounding the third region;
   in step (c), the polysilicon over the third region prevents gate oxide within the third region from being thinned;
   step (d) includes forming a capacitor top electrode within the third region; and,
   step (e) includes etching the polysilicon which is over the third region to form a capacitor bottom electrode.

5. A method comprising the following steps:
   (a) forming gate oxide within regions on a substrate;
   (b) forming gate material over a first region, the gate material extending over field oxide surrounding the first region;
   (c) stripping gate oxide within a second region, the gate material over the first region preventing gate oxide within the first region from being stripped;
   (d) forming a new layer of gate oxide within the second region;
   (e) forming a first transistor gate within the second region, including the following substeps:
      (e.1) depositing a layer of polysilicon,
      (e.2) depositing a layer of metal-silicide,
      (e.3) depositing a dielectric layer, and
      (e.4) etching the dielectric layer, the layer of metal-silicide and the layer of polysilicon to form the first transistor gate; and,
   (f) after forming the first transistor gate within the second region etching the gate material which is over the first region to form a second transistor gate.

6. A method as in claim 5 wherein step (f) includes the following substeps:
   (f.1) forming a first photo mask section over a portion of the gate material over the first region, and forming a second photo mask section over the second region;
   (f.2) etching an unmasked portion of the gate material over the first region in order to form the second transistor gate; and,
   (f.3) removing the first photo mask section and the second photo mask section.

7. A method as in claim 5 wherein in step (b) the gate material is polysilicon.

8. A method as in claim 5 wherein:
   step (b) includes forming gate material over a third region, the gate material extending over field oxide surrounding the third region;
   in step (c), the gate material over the third region prevents gate oxide within the third region from being thinned;
   step (e) includes forming a capacitor top electrode within the third region; and,
   step (f) includes etching the gate material which is over the third region to form a capacitor bottom electrode.

9. A method comprising the following steps:
   (a) on a substrate, forming separate regions, the regions being separated by field oxide;
   (b) forming gate oxide within the regions;
   (c) forming polysilicon over a first region, the polysilicon extending over field oxide surrounding the first region;
   (d) stripping gate oxide within a second region, the polysilicon over the first region preventing gate oxide within the first region from being stripped;
   (e) forming a new layer of gate oxide within the second region;
   (f) forming a first transistor gate within the second region, including the following substeps:
      (f.1) depositing a layer of polysilicon,
      (f.2) depositing a layer of metal-silicide,
      (f.3) depositing a dielectric layer, and
      (f.4) etching the dielectric layer, the layer of metal-silicide and the layer of polysilicon to form the first transistor gate;
   (g) placing resist masking over the second region, over the first transistor gate within the second region and over a portion of the polysilicon over the first region;
   (h) etching the polysilicon which is over the first region to form a second transistor gate, the transistor gate consisting of the portion of the polysilicon under the resist masking; and,
   (i) removing the resist masking.

10. A method as in claim 9 wherein:
    step (c) includes forming polysilicon over a third region, the polysilicon extending over field oxide surrounding the third region;
    in step (d), the polysilicon over the third region prevents gate oxide within the third region from being thinned;
    step (f) includes forming a capacitor top electrode within the third region; and,
    step (h) includes etching the polysilicon which is over the third region to form a capacitor bottom electrode.

11. A method comprising the following steps:
    (a) forming gate oxide within regions on a substrate;
    (b) forming polysilicon over a first region, the polysilicon extending over field oxide surrounding the first region;
    (c) thinning gate oxide within a second region, the polysilicon over the first region preventing gate oxide within the first region from being thinned;
    (d) forming a first transistor gate within the second region and a capacitor top electrode within the first region; and,
    (e) after the first transistor gate is formed within the second region and the capacitor top electrode is formed within the first region, etching the polysilicon which is over the first region to form a capacitor bottom electrode.

12. A method as in claim 11 wherein step (c) includes the following substeps:
    (c.1) stripping gate oxide within the second region; and,
    (c.2) forming a new layer of gate oxide within the second region, the new layer of gate oxide being thinner than the gate oxide stripped in substep (c.1).

13. A method as in claim 11 wherein step (d) includes the following substeps:
    (d.1) depositing a layer of polysilicon;

(d.2) depositing a layer of metal-silicide;

(d.3) depositing a dielectric layer; and, (d.4) etching the dielectric layer, the layer of metal-silicide and the layer of polysilicon to form the first transistor gate and the capacitor top electrode.

14. A method as in claim 11 wherein step (e) includes the following substeps:

(e.1) forming a first photo mask over a portion of the polysilicon over the first region, and forming a second photo mask over the second region; and, (e.2) etching an unmasked portion of the polysilicon over the first region in order to form the capacitor bottom electrode.

* * * * *